US007553726B2

(12) United States Patent
Yoon et al.

(10) Patent No.: US 7,553,726 B2
(45) Date of Patent: Jun. 30, 2009

(54) METHOD OF FABRICATING NONVOLATILE MEMORY DEVICE

(75) Inventors: In-gu Yoon, Uiwang-si (KR); Chul-soon Kwon, Seoul (KR); Jae-won Um, Yongin-si (KR); Jung-ho Moon, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 494 days.

(21) Appl. No.: 11/505,355

(22) Filed: Aug. 17, 2006

(65) Prior Publication Data

US 2007/0048924 A1    Mar. 1, 2007

(30) Foreign Application Priority Data

Aug. 25, 2005  (KR) .................. 10-2005-0078343

(51) Int. Cl.
*H01L 21/336*    (2006.01)
*H01L 21/8238*   (2006.01)

(52) U.S. Cl. .................. 438/257; 438/211; 438/197; 438/301; 438/303; 438/479; 257/E21.68; 257/E21.681; 257/E21.685; 257/E21.687; 257/E21.688

(58) Field of Classification Search ............ 257/E21.68, 257/E21.681, E21.685, E21.687, E21.688
See application file for complete search history.

(56) References Cited

U.S. PATENT DOCUMENTS

| 5,541,877 | A  | * | 7/1996  | Shirai ................. 365/185.01 |
| 5,939,749 | A  | * | 8/1999  | Taketa et al. ............. 257/316 |
| 7,236,398 | B1 | * | 6/2007  | Smolen et al. ........ 365/185.14 |
| 2003/0218920 | A1 | * | 11/2003 | Harari .................... 365/200 |

* cited by examiner

*Primary Examiner*—Walter L Lindsay, Jr.
*Assistant Examiner*—Mohsen Ahmadi
(74) *Attorney, Agent, or Firm*—Lee & Morse, P.C.

(57) ABSTRACT

A method of fabricating nonvolatile memory devices may involve forming separate floating gates on a semiconductor substrate, forming control gates on the semiconductor substrate, conformally forming a buffer film on a surface of the semiconductor substrate, injecting ions into the semiconductor substrate between the pairs of the floating gates to form a common source region partially overlapping each floating gate of the respective pair of the floating gates, depositing an insulating film on the buffer film, etching the buffer film and the insulating film at side walls of the floating gates and the control gates to form spacers at the side walls of the floating gates and the control gates, and forming a drain region in the semiconductor substrate at a side of the control gate other than a side of the control gate where the common source region is formed.

20 Claims, 6 Drawing Sheets

METHOD OF FABRICATING NONVOLATILE MEMORY DEVICE

BACKGROUND OF THE INVENTION

1. Field of the Invention

The present invention relates to methods of fabricating nonvolatile memory devices. More particularly, the present invention relates to a methods of fabricating nonvolatile memory devices having improved reliability.

2. Description of the Related Art

Nonvolatile memory devices are devices that are able to electrically erase data, program data and store data even in the absence of power. Nonvolatile memory devices are being used more often in a wide variety of fields.

Nonvolatile memory devices may be classified as stack gate types and split gate types. Split gate types of nonvolatile memory devices generally include a floating gate and a control gate, which are separated from each other.

When forming a common source of a split gate type nonvolatile memory device, ions may be injected in high doses and energy levels in order to partially overlap the common source with the floating gate. During formation of the common source ions, may be injected while the floating gate and tunnel oxide film are partially exposed. Thus, the floating gate and the tunnel oxide film may be damaged, attributable to the excess doses and energy levels, resulting in reduced reliability of the nonvolatile memory device.

SUMMARY OF THE INVENTION

The present invention is therefore directed to a method of fabricating nonvolatile memory device, which substantially overcomes one or more of the problems due to the limitations and disadvantages of the related art.

It is therefore a feature of an embodiment of the present invention to provide a method of fabricating more reliable nonvolatile memory devices.

At least one of the above and other features and advantages of the present invention may be realized by providing a method of fabricating nonvolatile memory devices that includes forming pairs of separate floating gates on a semiconductor substrate, forming control gates on the semiconductor substrate, each control gate partially overlapping one of the floating gates, conformally forming a buffer film on a surface of the semiconductor substrate on which the floating gates and the control gates are formed, injecting ions into the semiconductor substrate between the pairs of separate floating gates to form a common source region partially overlapping each floating gate of the respective pair of the floating gates, depositing an insulating film on the buffer film, etching the buffer film and the insulating film at side walls of the floating gates and the control gates to form spacers at the side walls of the floating gates and the control gates, and forming a drain region in the semiconductor substrate at a side of the control gate other than a side of the control gate where the common source region is formed.

The forming of the floating gates may include sequentially forming a gate insulating film and a conductive film on the semiconductor substrate, thermally oxidizing exposed portions of the conductive film to form oxide films, and sequentially etching the conductive film and the gate insulating film, using the oxide films as an etching mask to form the floating gates. The forming of the control gate may include sequentially layering a tunnel insulating film and a conductive film on a side of the semiconductor substrate on which the floating gates are formed, and partially etching the tunnel insulating film and the conductive film to form the control gates.

The tunnel insulating film and the conductive film may be formed on an entire surface of the side of the semiconductor substrate on which the floating gates are formed. The buffer film may be formed to be about 100 Å to about 150 Å thick. The buffer film may be formed using a chemical vapor deposition process. The buffer film may be a medium temperature oxide film. The insulating film may be used to form the spacers is a nitride film. The ion injection may be conducted at energy of about 20 KeV to about 40 KeV. The ion injection may be conducted at a dose of about $2\times10^{15}$ ions/cm$^2$ to about $6\times10^{15}$ ions/cm$^2$.

At least one of the above and other features and advantages of the present invention may be separately realized by providing a method of fabricating a memory device on a semiconductor substrate that includes physically dividing the semiconductor substrate into an active region and a field region, forming a pair of separate floating gates on the active region of the semiconductor substrate, forming a non-planar control gate on the active region of semiconductor substrate, the non-planar control gate partially overlapping an upper surface of one of the floating gates and having a shape corresponding to a shape of a combination of the respective partially overlapping floating gate and an upper surface of the semiconductor substrate, forming a buffer film to overlap an entire side of the active region of semiconductor substrate on which the floating gates and the control gates are formed, injecting ions into the semiconductor substrate between the pair of separate floating gates to form a common source region partially overlapping each floating gate of the pair of the floating gates, depositing an insulating film on the buffer film, forming multi-layer sidewall spacers adjacent to sidewalls of the non-planar control gates and the floating gates by patterning the insulating film and the buffer film, and for each non-planar control gate, forming a drain region in a portion of the semiconductor substrate, other than the common source region, which is adjacent to a side of the non-planar control gate, such that one of the non-planar control gates and the respective floating gate overlap a portion of the semiconductor substrate between the respective drain and common source regions.

A first end portion of the non-planar control gate may be formed on the upper surface of the respective floating gate such that a respective one of the sidewalls of the non-planar control gate may be arranged on the upper surface of the respective floating gate. A second end portion of the non-planar control gate may continuously extend from the first end portion of the non-planar control gate covering a sidewall of the respective floating gate and a portion of the semiconductor substrate, which is adjacent to the respective floating gate, other than the common source region.

At least one of the above and other features and advantages of the present invention may be separately realized by providing a method of fabricating a memory device on a semiconductor substrate that includes forming a pair of separate floating gates on the semiconductor substrate, forming control gates on the semiconductor substrate, each control gate having a first portion partially overlapping one of the floating gates and a second portion covering a portion of the semiconductor substrate other than where the respective floating gate is formed, such that a first portion of each floating gate remains exposed and a second portion of the floating gate is covered by first portion of the control gate, conformally forming a buffer spacer film on a surface of the semiconductor substrate on which the floating gates and the control gates are formed, injecting ions into the semiconductor substrate between the pair of separate floating gates to form a common source region partially overlapping each floating gate of the pair of the floating gates, the ions being injected through the buffer spacer film, depositing an insulating spacer film on the buffer spacer film, forming multi-layer sidewall spacers adjacent to sidewalls of the non-planar control gates and sidewalls of the first portion of the floating gates by patterning the insulating spacer film and the buffer spacer film, and for each control gate, forming a drain region in a portion of the semiconductor substrate, other than the common source region, which is adjacent to the second portion of the control gate.

The buffer spacer layer may be formed before the ions are injected to form the common source region, and the buffer insulating layer may be formed after the ions are injected to form the common source region. The injecting of ions into the semiconductor substrate may include injecting ions over the first portion of the floating gates covered by the buffer spacer layer. Forming the control gates may include sequentially forming a tunnel insulating film and a conductive film on a side of the semiconductor substrate on which the floating gates are formed, thermally oxidizing exposed portions of the conductive film to form oxide film, and sequentially etching the conductive film and the gate insulating film using the oxide films as an etching mask to form the floating gates.

The method may further include forming a mask overlapping the control gate and exposing the first portion of the floating gates and portions of the buffer spacer layer between first portions of the pair of floating gates prior to injecting ions to form the common source region. The method may further include forming a mask overlapping the control gate, the first and second portions of the floating gate and the common source region between the pair of floating gates prior to forming the drain regions. Forming of multi-layer sidewall spacers may include selectively etching portions of the buffer spacer layer and the insulating spacer layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
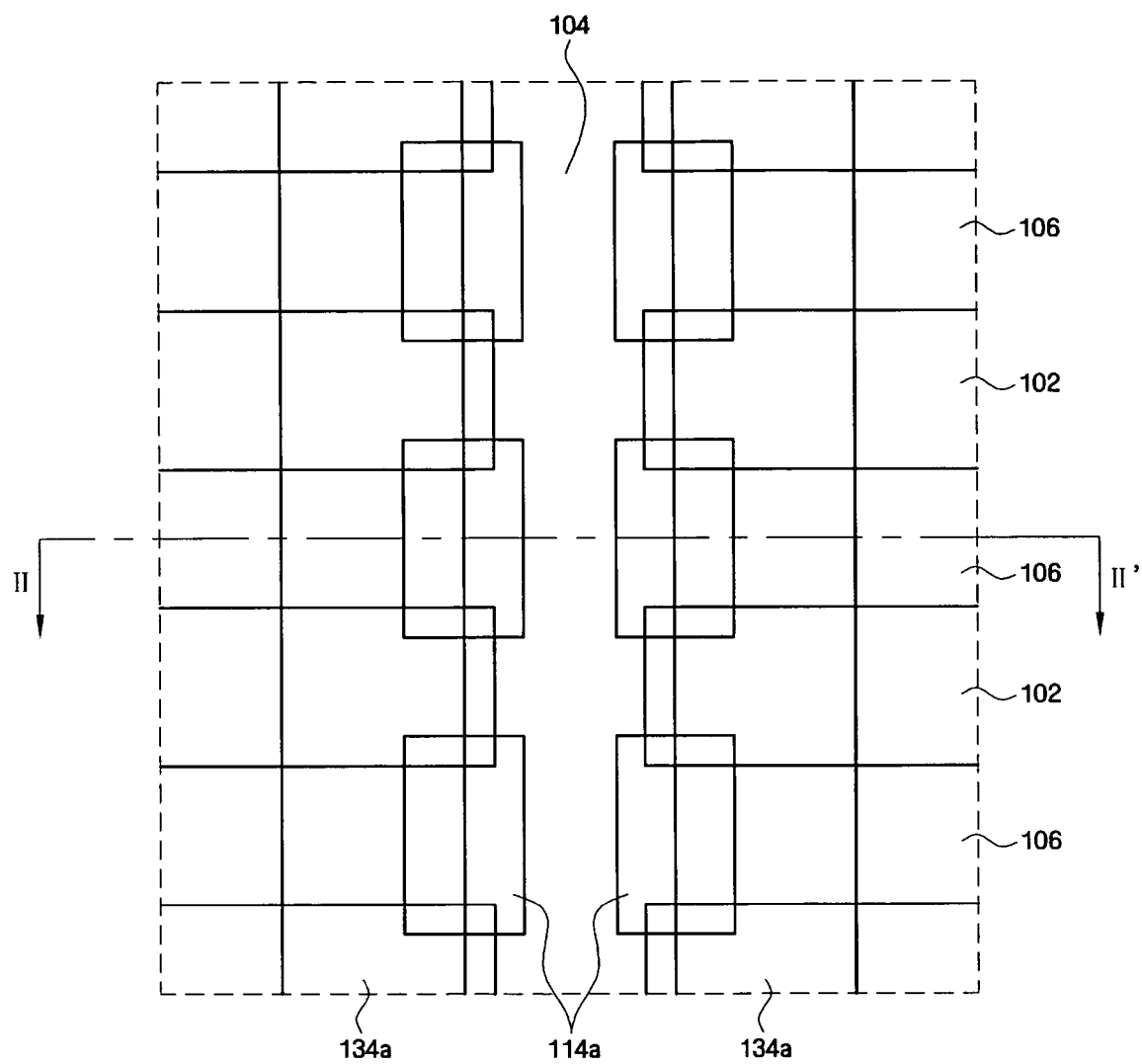
FIG. 1 illustrates a layout view showing a nonvolatile memory device, according to the present invention.

Korean Patent Application No. 10-2005-0078343 filed on Aug. 25, 2005, in the Korean Intellectual Property Office, and entitled: "Method of Fabricating Nonvolatile Memory Device," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The structure and operation of exemplary embodiments of nonvolatile memory devices according to one or more aspects of the invention will be described with reference to FIGS. 1 and 2.

Figure 2:
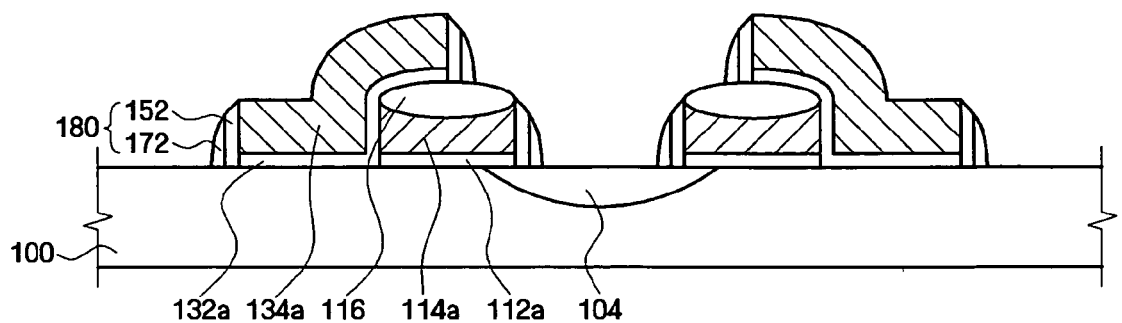
FIG. 2 illustrates a cross-sectional view of the non-volatile memory device illustrated in FIG. 1, along the line II-II' of FIG. 1.

FIG. 1 illustrates a layout view of a nonvolatile memory device according to the present invention, and FIG. 2 illustrates a cross-sectional view taken along the line II-II' of FIG. 1.

As illustrated in FIGS. 1 and 2, device separation films 102 may be formed on a semiconductor substrate 100 to define a field region and an active region. The active region may include a common source region 104 and drain regions 106. The drain regions 106 may be spaced apart from the common source region 104.

A plurality of separate floating gates 114a may be formed on the semiconductor substrate 100. The separate floating gates 114a may partially overlap the common source region 104. In embodiments of the invention, pairs of separate floating gates 114a may be formed such that a first floating gate 114a of a pair may be formed on one side of the common source region 104 and another floating gate 114a of the pair may be formed on an opposing side of the common source region 104. A gate insulating film 112a may be positioned beneath each of the pairs of the floating gates 114a. An oval oxide film 116 may be formed on the separate floating gates 114a.

A control gate 134a may be formed over an upper surface of the semiconductor substrate 100. The control gate 134a may be formed to cover the drain region 106 and the floating gate 114a, and may be formed adjacent to the drain region 106 and on an upper surface of the floating gate 114a. The control gate 134a may overlap the upper surface of the oxide film 116 on the floating gate 114a. As illustrated in FIG. 2, e.g., the control gate 134a may partially cover the upper surface of the oxide film 116, and may cover the side wall of the floating gate 114a opposite the common source region 104. A tunnel insulating film 132a may be formed beneath the control gate 134a, and may be sandwiched, e.g., between the control gate 134a and the substrate 100, between the control gate 134a and the floating gate 114a, between the control gate 134a and the oval oxide film 116, and/or between the control gate 134a and the gate insulating film 112a.

A spacer 180 may be formed on side walls of the floating gates 114a and the control gates 134a. The spacer 180 may overlap sidewalls of the control gate 134a, sidewall of the floating gate 114a, sidewalls of the gate insulating film 112a and/or sidewalls of the tunnel insulating film 132a. In embodiments of the invention, the spacer 180 may be a multi-layer spacer, e.g., a two layer spacer including a buffer film 152 and an insulating film 172.

In embodiments of a nonvolatile memory device according to one or more aspects of the invention, the floating gate 114a and the control gate 134a may be separated from each other, and the floating gate 114a may be electrically insulated from the exterior of the device.

Operation of an exemplary nonvolatile memory device employing one or more aspects of the invention will be described below. When a data programming process is conducted, a high voltage may be applied to the common source region 104 and the control gates 134a, and channels may be formed between the common source region 104 and each of the drain regions 106. Electrons generated in the drain region 106 may be injected into the floating gates 114a by CHEI (Channel Hot Electron Injection). The gate insulating film 112a may function to couple the voltage applied to the common source region 104 to increase the potential of the floating gate 114a.

When a data erasing process is conducted, a ground voltage may be applied to the drain regions 106 and the common source region 104, and a high voltage may be applied to the control gates 134a. An electrical field may be generated between the floating gate 114a and the control gate 134a, and electrons in the floating gate 114a may be transferred to the control gate 134a through the tunnel oxide film 132a by an F-N (Fowler-Norheim) tunneling process. The tunnel insulating film 132a may function to decrease the coupling ratio between the floating gate 114a and the control gate 134a so as to maintain a large difference in potential between the floating gate 114a and the control gate 134a.

Turning now to FIGS. 3 to 11, stages in an exemplary method of fabricating the nonvolatile memory device, according to one or more aspects of the invention is described below.

FIGS. 3 to 11 illustrate cross-sectional views of sequential stages in an exemplary process of fabricating the nonvolatile memory device, according to one or more aspects of the present invention.

Initially, a device separation process may be performed during which device separation films 102 may be formed on the semiconductor substrate 100 to separate each device, e.g., memory cell on the semiconductor substrate 100. The device separation films 102 may define the field region and the active region on the semiconductor substrate 100. The device separation process may include, e.g., LOCOS (Local Oxidation of Silicon) or STI (Shallow Trench Isolation).

Figure 3:
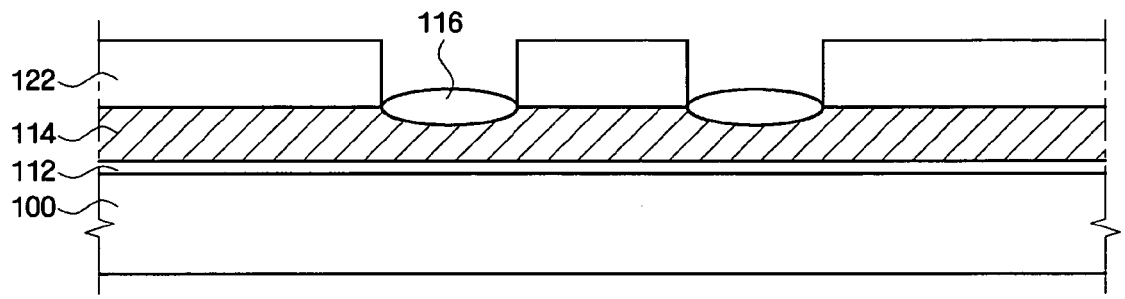
FIGS. 3 to 11 illustrate cross-sectional views of sequential stages in an exemplary process of fabricating the nonvolatile memory device, according to one or more aspects of the present invention.
Figure 4:
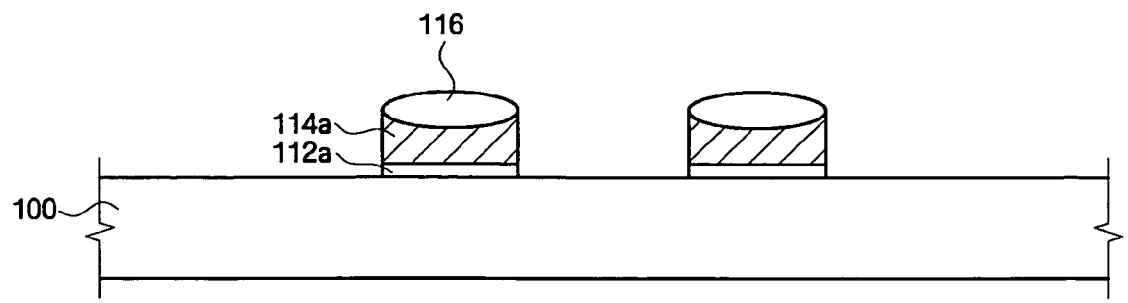

As illustrated in FIG. 3, a gate insulating film 112 and a conductive film 114 may be formed on the active region of the semiconductor substrate 100, as may be defined by the device separation films 102. The gate insulating film 112 may be, e.g., a silicon oxide ($SiO_2$) film, and may be about 50 Å to about 150 Å thick, including exactly 50 Å and exactly 150 Å. The gate insulating film 112 may be formed by a thermal oxidation process. The conductive film 114 may be formed to a thickness of about 500 Å to about 2000 Å, including exactly 500 Å and exactly 2000 Å. The conductive film 114 may be formed by a deposition of doped poly-silicon (poly-Si). In embodiments of the invention, the poly-Si may be doped in-situ while being deposited. In embodiments of the invention, the poly-Si may be doped by forming undoped poly-Si and then injecting a dopant.

Next, another insulating film may be deposited and patterned on the conductive film 114, forming an insulating film pattern 122 for exposing predetermined portions of the conductive film 114. The insulating film pattern 122 may be formed with a silicon nitride (SiN) film. The exposed portions of the conductive film 114 may be oxidized, thus forming oxide films 116. The oxide film 116 may be formed into, e.g., an oval shape by a thermal oxidation process.

The insulating film pattern 122 may then be removed, and the conductive film 114 and the gate insulating film 112 may be, e.g., selectively etched using the oxide film 116 as an etching mask. Patterning of the conductive film 114 and the gate insulating film 112 via, e.g., selective etching, may result in the structure illustrated in FIG. 4, which includes floating gates 114a and the gate insulating film 112a beneath each of the floating gates 114a.

Figure 5:
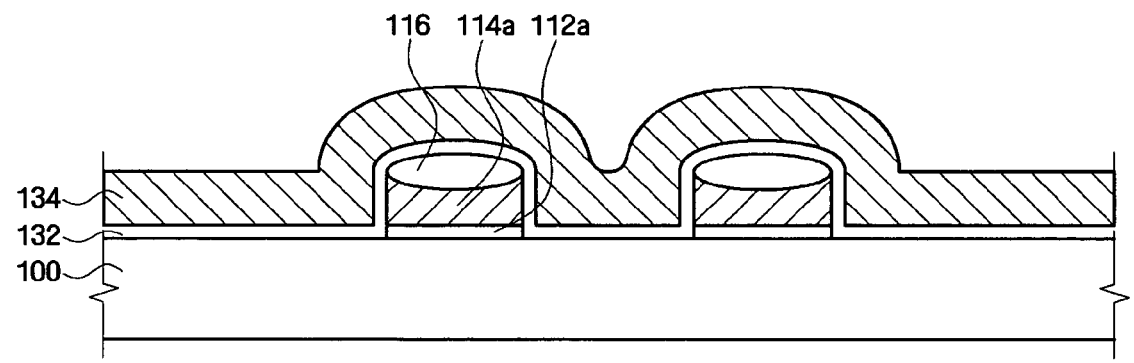

Next, as illustrated in FIG. 5, a tunnel insulating film 132 and a conductive film 134 may be formed on an upper surface of the semiconductor substrate 100 on which the floating gates 114a may be formed. The tunnel insulating film 132 and the conductive film 134 may be formed on the entire upper side of the semiconductor substrate 100 on which the floating gates 114a may be formed. The tunnel insulating film 132 may be formed to a thickness of about 50 Å to about 200 Å, including exactly 50 Å and exactly 200 Å. The tunnel insulating film 132 may be formed by, e.g., thermal oxidation or chemical vapor deposition (CVD). The conductive film 134 may be formed to a thickness of about 500 Å to about 2000 Å, including exactly 500 Å and exactly 2000 Å. The conductive film 134 may be formed by deposition of doped poly-Si.

Figure 6:
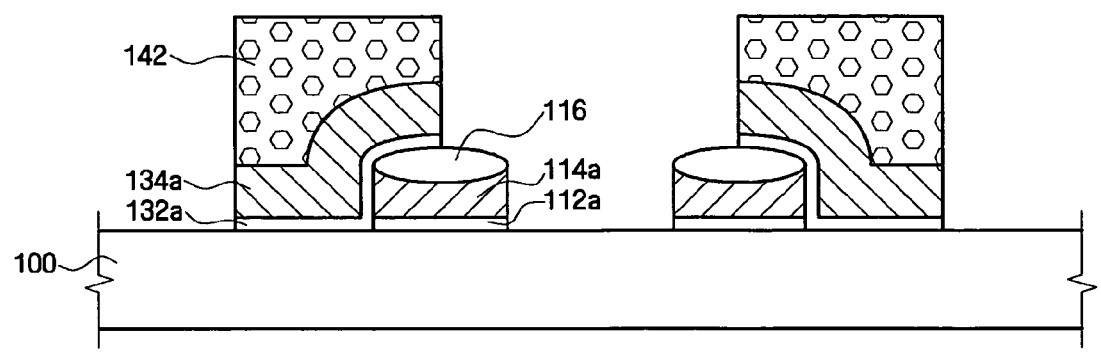

As illustrated in FIG. 6, a mask 142 may be formed on the conductive film 134. The mask 142 may be used to form the control gates 134a by patterning the conductive film 134. Patterning of the conductive film 134 may also define side walls of the control gate 134a. The conductive film 134 and the tunnel insulating film 132 may be selectively etched using the mask 142, thereby forming the control gates 134a and the tunneling insulating film 132a beneath each of the control gates 134a. Each of the control gates 134a may be symmetrically formed, and may be conformally formed over the upper surface of the semiconductor substrate 100, the side wall of each of the floating gates 114a, and part of the upper surface of each of the floating gates 114a. The control gates 134a may at least partially cover the floating gates 114a, the upper surface of the semiconductor substrate 110, and the side wall of each of the floating gates 114a. After formation of the control gates 134a, the mask 142 may be removed.

In embodiments of the invention, formation of the control gates 134a may result in at least partial coverage of at least one of the side walls of the respective floating gate 114a, the semiconductor substrate 100, the respective gate insulating layer 112a, and the oval oxide film 116 and the exposure of at least one of the side walls of the respective floating gate 114a, part of an upper surface of the respective oval oxide film 116, part of the tunnel insulating film 132a, and at least one side wall of the respective gate insulating film 112a.

Figure 7:
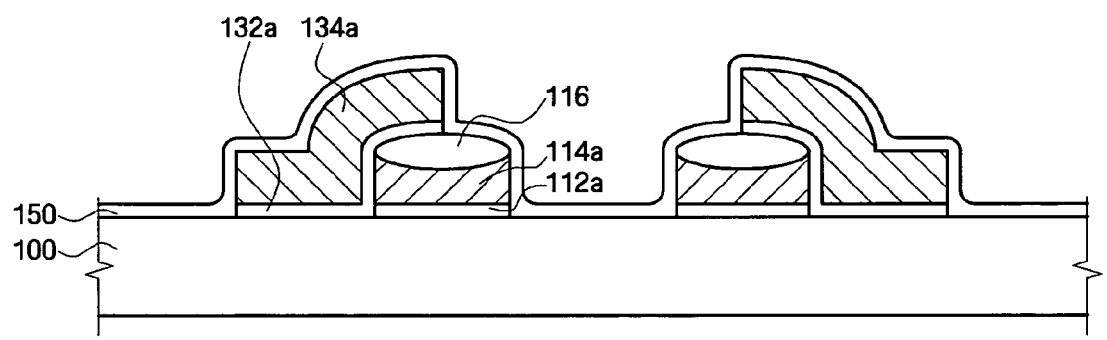

Next, as illustrated in FIG. 7, a buffer film 150 may be formed on the upper surface of the semiconductor substrate 100 on which the floating gates 114a and the control gates 134a may be formed. The buffer film 150 may later be used as material for forming a spacer. In embodiments of the invention, the buffer film 150 may be formed to a thickness of about 100 Å to about 150 Å, including exactly 100 Å and exactly 150 Å. The buffer film 150 may be formed by, e.g. CVD, and may be formed into an MTO (Medium Temperature Oxide) film. The formed buffer film 150 may cover the exposed side walls of each of the floating gates 114a, exposed sidewalls of the gate insulating film 112a, the exposed portion the upper surface of the oxide film 116 on the floating gate 114a, the upper surface of the semiconductor substrate 100, exposed portions of the tunnel insulating film 132a, and the control gates 134a. Upon subsequent formation of the common source region 104, damage to the floating gate 114a and the exposed tunnel insulating film 132a due to excess ion injection may be reduced and/or prevented.

Figure 8:
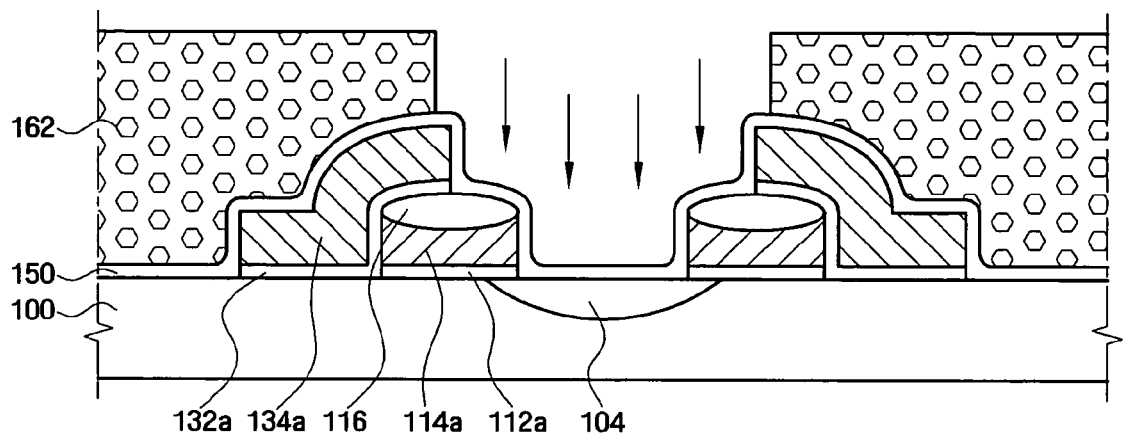

As illustrated in FIG. 8, an ion injection mask 162 may be formed over the buffer film 150. The ion injection mask 162 may be formed and/or patterned to expose a portion of the buffer film 150 between the pairs of the floating gates 114a. In embodiments of the invention, the ion injection mask 162 may expose the buffer film 150 formed on the semiconductor substrate 100 between adjacent ones of the floating gates 114a, and may also expose a portion of the buffer film 150 on the floating gates 114a, the gate insulating film 112a, the tunnel insulating film 132a and the control gates 134a because of the very small intervals between the floating gates 114a. During an ion injection process, using the ion injection mask 162, when ions are injected into the semiconductor substrate 100, a dopant may be passed through the buffer film 150 to form the common source region 104 in the semiconductor substrate 100. The dopant may be formed, e.g., of P or As ions. The ions may be injected at a dose of about $2\times10^{15}$ ions/cm$^2$ to about $6\times10^{15}$ ion s/cm$^2$, including exactly $2\times10^{15}$ ions/cm$^2$ and exactly $6\times10^{15}$ ion s/cm$^2$, at an energy of about 20 KeV to about 40 KeV, including exactly 20 KeV and 40 KeV.

By injecting the dopant at relatively high doses and energy levels to form the common source region 104, the common source region 104 may be made to partially overlap each of the floating gates 114a. In embodiments of the invention, the buffer film 150 may cover portions of, e.g., the floating gate 114a, the oxide film 116, the tunnel oxide film 132 and/or the control gates 134a, which may otherwise be exposed, such that during ion injection and formation of the common source region 104, damage to the floating gate 114a, the oxide film 116 and the tunnel oxide film 132a may be reduced and/or prevented.

Figure 9:
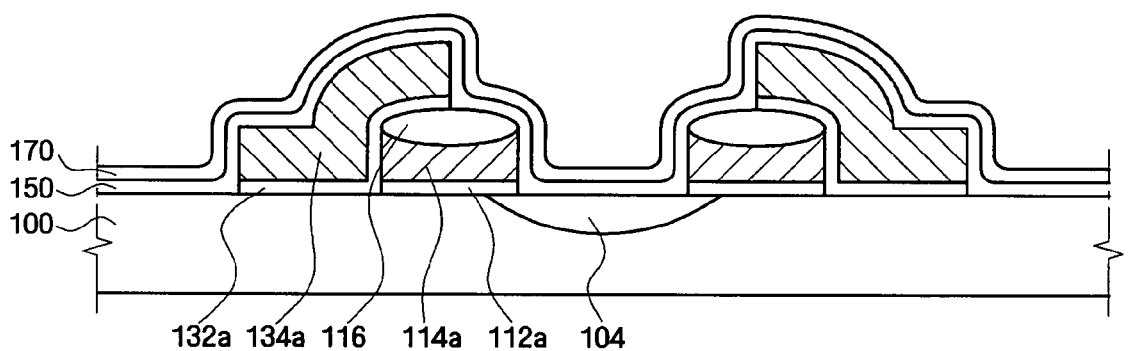

Next, as illustrated in FIG. 9, the ion injection mask 162 may be removed, and an upper surface of the buffer film 150 may be exposed. An insulating film 170, for forming a spacer, may be conformally deposited on the buffer film 150. The insulating film 170 may be formed, e.g., using silicon nitride (SiN) through CVD.

Figure 10:
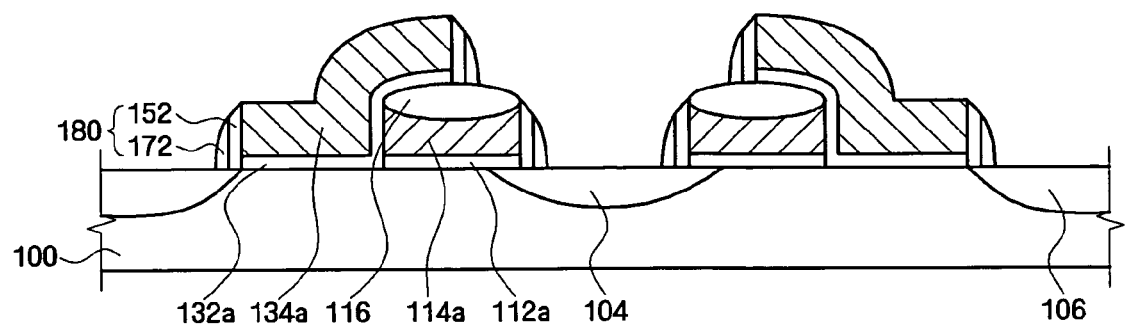

As illustrated in FIG. 10, the buffer film 150 and the insulating film 170 may be patterned using, e.g., anisotropic etching, to form a spacer 180 at each of the side walls of the floating gates 114a and the control gates 134a. The spacer 180 may include the buffer film 152 and the nitride film 172 and may reduce and/or prevent deterioration of the electrical properties of the floating gate 114a and the control gate 134a. In embodiments of the invention, during formation of the common source region 104, the buffer film 150 may have been previously used to reduce and/or prevent damage to the floating gate 114a and the tunnel insulating film 132a, and may be subsequently patterned, via, e.g., anisotropic etching, to form the spacer 180. Thus, in embodiments of the invention, damage to the floating gate 114a and the tunnel insulating film 132a may be prevented without increasing a number of processing steps and reliability of the resulting nonvolatile memory devices may be increased.

Figure 11:
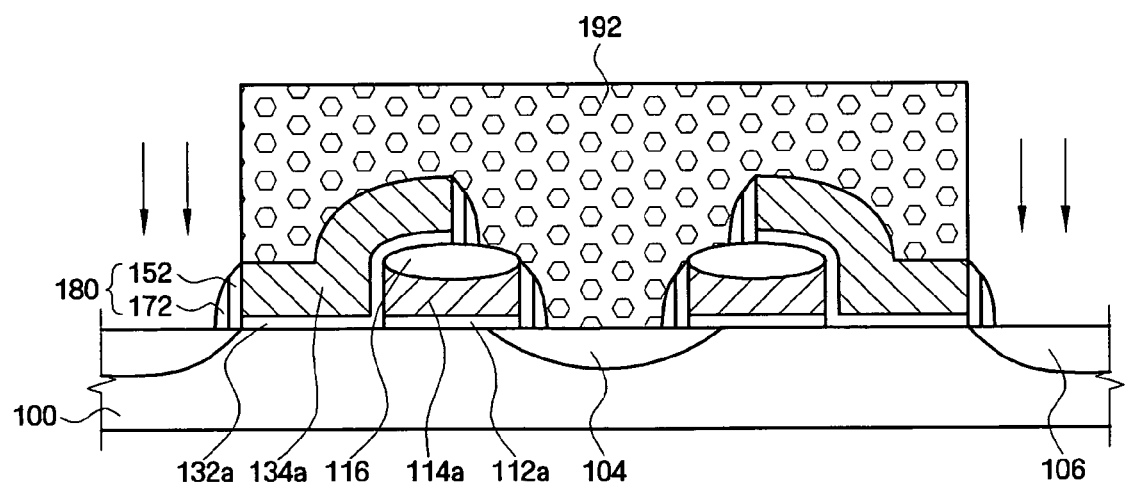

Next, as illustrated in FIG. 11, an ion injection mask 192 may be formed over the common source region 104 and the control gates 134a. The ion injection mask 192 may be used to form drain regions 106. An upper surface of the semiconductor substrate 100 adjacent to the control gate 134a may be exposed and not covered by the ion injection mask 192. A dopant may then be injected into the semiconductor substrate 100 to form the drain regions 106. After the drain regions 106 are formed, the ion injection mask 192 may be removed, resulting in a nonvolatile memory device, such as the nonvolatile memory device illustrated in FIGS. 1 and 2.

Embodiments of the invention provide a method of fabricating nonvolatile memory devices having improved reliability without increasing a number of processing steps. In embodiments of the invention, a buffer layer may initially be used to protect portions of the non-volatile memory device formed prior to formation of a common source region of floating gates, oxide films and tunnel insulating films are protected by the buffer film upon an ion injection process for the formation of a common source region. As such, the buffer film used is formed into material for use in a spacer upon subsequent procedures, and thus there is no need for any additional process.

Therefore, damage to the floating gate and the tunnel insulating film due to the excess ion injection upon formation of the common source region can be reduced and/or prevented, thus increasing the reliability of the nonvolatile memory device.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a nonvolatile memory device, comprising:

forming pairs of separate floating gates on a semiconductor substrate;

forming control gates on the semiconductor substrate, each control gate partially overlapping one of the floating gates;

conformally forming a buffer film on a surface of the semiconductor substrate on which the floating gates and the control gates are formed;

injecting ions into the semiconductor substrate between the pairs of separate floating gates to form a common source region partially overlapping each floating gate of the respective pair of the floating gates;

depositing an insulating film on the buffer film;

etching the buffer film and the insulating film at side walls of the floating gates and the control gates to form spacers at the side walls of the floating gates and the control gates; and forming drain regions in the semiconductor substrate at a respective side of the control gates other than a side of the control gates where the common source region is formed.

2. The method as claimed in claim 1, wherein the forming of the floating gates comprises:

sequentially forming a gate insulating film and a conductive film on the semiconductor substrate;

thermally oxidizing exposed portions of the conductive film to form oxide films; and sequentially etching the conductive film and the gate insulating film using the oxide films as an etching mask to form the floating gates.

3. The method as claimed in claim 1, wherein the forming of the control gate comprises:

sequentially layering a tunnel insulating film and a conductive film on a side of the semiconductor substrate on which the floating gates are formed; and partially etching the tunnel insulating film and the conductive film to form the control gates.

4. The method as claimed in claim 3, wherein the tunnel insulating film and the conductive film are formed on an entire surface of the side of the semiconductor substrate on which the floating gates are formed.

5. The method as claimed in claim 1, wherein the buffer film is formed to be about 100 Å to about 150 Å thick.

6. The method as claimed in claim 1, wherein the buffer film is formed using a chemical vapor deposition process.

7. The method as claimed in claim 1, wherein the buffer film is a medium temperature oxide film.

8. The method as claimed in claim 1, wherein the insulating film used to form the spacers is a nitride film.

9. The method as claimed in claim 1, wherein the ions are injected with an energy of about 20 KeV to about 40 KeV.

10. The method as claimed in claim 1, wherein the ions are injected at a dose of about $2 \times 10^{15}$ ions/cm$^2$ to about $6 \times 10^{15}$ ions/cm$^2$.

11. A method of fabricating a memory device on a semiconductor substrate, the method comprising:

physically dividing the semiconductor substrate into an active region and a field region;

forming a pair of separate floating gates on the active region of the semiconductor substrate;

forming a non-planar control gate on the active region of semiconductor substrate, the non-planar control gate partially overlapping an upper surface of one of the floating gates and having a shape corresponding to a shape of a combination of the respective partially overlapping floating gate and an upper surface of the semiconductor substrate;

forming a buffer film to overlap an entire side of the active region of semiconductor substrate on which the floating gates and the control gates are formed;

injecting ions into the semiconductor substrate between the pair of separate floating gates to form a common source region partially overlapping each floating gate of the pair of the floating gates;

depositing an insulating film on the buffer film;

forming multi-layer sidewall spacers adjacent to sidewalls of the non-planar control gates and the floating gates by patterning the insulating film and the buffer film; and for each non-planar control gate, forming a drain region in a portion of the semiconductor substrate, other than the common source region, which is adjacent to a side of the non-planar control gate, such that one of the non-planar control gates and the respective floating gate overlap a portion of the semiconductor substrate between the respective drain and common source regions.

12. The method as claimed in claim 11, wherein a first end portion of the non-planar control gate is formed on the upper surface of the respective floating gate such that a respective one of the sidewalls of the non-planar control gate is arranged on the upper surface of the respective floating gate.

13. The method as claimed in claim 12, wherein a second end portion of the non-planar control gate continuously extends from the first end portion of the non-planar control gate covering a sidewall of the respective floating gate and a portion of the semiconductor substrate, which is adjacent to the respective floating gate, other than the common source region.

14. A method of fabricating a memory device on a semiconductor substrate, the method comprising:

forming a pair of separate floating gates on the semiconductor substrate;

forming control gates on the semiconductor substrate, each control gate having a first portion partially overlapping one of the floating gates and a second portion covering a portion of the semiconductor substrate other than where the floating gate is formed, such that a first portion of each floating gate remains exposed and a second portion of the floating gate is covered by first portion of the control gate;

conformally forming a buffer spacer film on a surface of the semiconductor substrate on which the floating gates and the control gates are formed;

injecting ions into the semiconductor substrate between the pair of separate floating gates to form a common source region partially overlapping each floating gate of the pair of the floating gates, the ions being injected through the buffer spacer film;

depositing an insulating spacer film on the buffer spacer film;

forming multi-layer sidewall spacers adjacent to sidewalls of the non-planar control gates and sidewalls of the first portion of the floating gates by patterning the insulating spacer film and the buffer spacer film; and for each control gate, forming a drain region in a portion of the semiconductor substrate, other than the common source region, which is adjacent to the second portion of the control gate.

15. The method as claimed in claim 14, wherein the buffer spacer layer is formed before the ions are injected to form the common source region, and the buffer insulating layer is formed after the ions are injected to form the common source region.

16. The method as claimed in claim 14, wherein the injecting of ions into the semiconductor substrate includes injecting ions over the first portion of the floating gates covered by the buffer spacer layer.

17. The method as claimed in claim 14, wherein forming the control gates comprises:

sequentially forming a tunnel insulating film and a conductive film on a side of the semiconductor substrate on which the floating gates are formed;

thermally oxidizing exposed portions of the conductive film to form oxide films; and sequentially etching the conductive film and the gate insulating film using the oxide films as an etching mask to form the floating gates.

18. The method as claimed in claim 14, further comprising forming a mask overlapping the control gate and exposing the first portion of the floating gates and a portion of the buffer spacer layer between first portions of the pair of floating gates prior to injecting ions to form the common source region.

19. The method as claimed in claim 14, further comprising forming a mask overlapping the control gate, the first and second portions of the floating gate and the common source region between the pair of floating gates prior to forming the drain regions.

20. The method as claimed in claim 14, wherein the forming of multi-layer sidewall spacers comprises selectively etching portions of the buffer spacer layer and the insulating spacer layer.

* * * * *